United States Patent
Ueng et al.

(10) Patent No.: US 10,320,427 B2
(45) Date of Patent: Jun. 11, 2019

(54) NON-ORTHOGONAL MULTIPLE ACCESS DATA TRANSMISSION METHOD AND TRANSMISSION DEVICE

(71) Applicant: National Tsing Hua University, Hsinchu (TW)

(72) Inventors: Yeong-Luh Ueng, Hsinchu (TW); Wei-Min Lai, Hsinchu (TW)

(73) Assignee: National Tsing Hua University, Hsinchu (TW)

( * ) Notice: Subject to any disclaimer, the term of this patent is extended or adjusted under 35 U.S.C. 154(b) by 1 day.

(21) Appl. No.: 15/642,346

(22) Filed: Jul. 6, 2017

(65) Prior Publication Data

US 2018/0309462 A1  Oct. 25, 2018

(30) Foreign Application Priority Data

Apr. 21, 2017 (TW) .............................. 106113534 A

(51) Int. Cl.
*H03M 13/00* (2006.01)
*H03M 13/29* (2006.01)
(Continued)

(52) U.S. Cl.
CPC ....... *H03M 13/293* (2013.01); *H03M 13/033* (2013.01); *H03M 13/156* (2013.01);
(Continued)

(58) Field of Classification Search
CPC ............. H03M 13/293; H03M 13/156; H03M 13/1105; H03M 13/152; H03M 13/033;
(Continued)

(56) References Cited

U.S. PATENT DOCUMENTS

| 8,301,974 B2 | 10/2012 | Abu-Surra et al. |
| 8,737,519 B2 * | 5/2014 | Jeong ................... H04L 1/0057 375/295 |

(Continued)

FOREIGN PATENT DOCUMENTS

| CN | 101414865 | 4/2009 |
| CN | 106385300 | 2/2017 |

(Continued)

OTHER PUBLICATIONS

"Office Action of Taiwan Counterpart Application", dated Apr. 17, 2018, p. 1-p. 7.

Mohammad Jabbari Hagh et al.,"Raptor Coding for Non-Orthogonal Multiple Access Channels", 2011 IEEE International Conference on Communications (ICC), Jun. 5-9, 2011,pp. 1-6.

*Primary Examiner* — Christine T. Tu
(74) *Attorney, Agent, or Firm* — JCIPRNET

(57) ABSTRACT

The disclosure provides a non-orthogonal multiple access data transmission method and a transmission device using the same. The method includes: performing channel encoding for a plurality of data and a plurality of identifiers respectively corresponding to the plurality of data by using Raptor code so as to generate a Raptor codeword, wherein the plurality of identifiers respectively correspond to a plurality of receiving terminals; and modulating the Raptor codeword to generate a plurality of modulation symbols and broadcasting the plurality of modulation symbols.

13 Claims, 2 Drawing Sheets

(51) Int. Cl.
*H03M 13/15* (2006.01)
*H04L 1/00* (2006.01)
*H03M 13/03* (2006.01)
*H03M 13/37* (2006.01)
*H04B 1/40* (2015.01)
*H03M 13/11* (2006.01)

(52) U.S. Cl.
CPC ..... *H03M 13/2906* (2013.01); *H03M 13/373* (2013.01); *H03M 13/3761* (2013.01); *H04L 1/0042* (2013.01); *H04L 1/0046* (2013.01); *H04L 1/0057* (2013.01); *H03M 13/1102* (2013.01); *H03M 13/1105* (2013.01); *H03M 13/152* (2013.01); *H04B 1/40* (2013.01)

(58) Field of Classification Search
CPC ........... H03M 13/2906; H03M 13/373; H03M 13/3761; H03M 13/1102; H04L 1/0042; H04L 1/0046; H04L 1/0057; H04B 1/40
See application file for complete search history.

(56) References Cited

U.S. PATENT DOCUMENTS

| | | | |
|---|---|---|---|
| 2010/0100792 A1* | 4/2010 | Abu-Surra | H03M 13/118 |
| | | | 714/755 |
| 2014/0068386 A1* | 3/2014 | Chen | H03M 13/05 |
| | | | 714/776 |
| 2015/0280744 A1 | 10/2015 | Kim et al. | |
| 2016/0087652 A1 | 3/2016 | Ha et al. | |
| 2016/0174230 A1 | 6/2016 | Benjebbour | |
| 2017/0033806 A1 | 2/2017 | Arslan et al. | |

FOREIGN PATENT DOCUMENTS

| | | |
|---|---|---|
| CN | 106571891 | 4/2017 |
| TW | I407720 | 9/2013 |
| TW | I519143 | 1/2016 |
| TW | 201620279 | 6/2016 |

\* cited by examiner

… (1)

NON-ORTHOGONAL MULTIPLE ACCESS DATA TRANSMISSION METHOD AND TRANSMISSION DEVICE

CROSS-REFERENCE TO RELATED APPLICATION

This application claims the priority benefit of Taiwan application serial no. 106113534, filed on Apr. 21, 2017. The entirety of the above-mentioned patent application is hereby incorporated by reference herein and made a part of this specification.

BACKGROUND

Technical Field

The disclosure relates to a method and a device for data transmission, and particularly relates to a non-orthogonal multiple access data transmission method and a transmission device.

Description of Related Art

Since non-orthogonal multiple access (NOMA) techniques are capable of providing higher transmission efficiency than conventional orthogonal multiple access techniques with the same bandwidth resources, the NOMA has been viewed as one of the candidates for the multiple access technology of fifth generation wireless systems.

In the NOMA system, multi-user multiple access is performed in the power domain of the transmitting terminal, and then multi-user signals are separated by employing successive interference cancellation (SIC) techniques at the receiving terminal. Specifically, in order to correctly modulate multiple user data sent by the base station at each user equipment terminal, the NOMA system, in the case where the total transmit power is fixed, allocates more transmit power to the user equipment with inferior channel conditions while allocating less transmit power to the user equipment with better channel conditions. In this way, the user equipment terminal may perform decoding and obtain the user data belonging to itself by implementing the SIC techniques. However, there are still some problems waiting to be solved regarding such NOMA scheme achieved by power adjustment. For example, since the transmit power is determined by the base station according to the location of the user equipment, when the locations of a plurality of user equipments are close to one another, each of the allocated transmit power likewise becomes similar Thus it is easy to result in reduced efficiency and accuracy of the user equipment in implementing the SIC techniques.

Consequently, for a person skilled in the art, how to solve the problem of reduced bandwidth efficiency caused by signal interference among the closely located user equipments in the NOMA system is indeed an issue of concern.

SUMMARY

The disclosure provides a non-orthogonal multiple access data transmission method and a transmission device.

The disclosure proposes a transmission device adapted for non-orthogonal multiple access data transmission, including a Raptor code encoding circuit, a modulation circuit, and a transceiver circuit. The Raptor code encoding circuit performs channel encoding for a plurality of data and a plurality of identifiers respectively corresponding to the plurality of data by using Raptor code so as to generate a Raptor codeword, wherein the plurality of identifiers respectively correspond to a plurality of receiving terminals. The modulation circuit is coupled to the Raptor code encoding circuit and modulates the Raptor codeword to generate a plurality of modulation symbols. The transceiver circuit is coupled to the modulation circuit and broadcasts the plurality of modulation symbols.

The disclosure proposes a non-orthogonal multiple access data transmission method, including: performing channel encoding for a plurality of data and a plurality of identifiers respectively corresponding to the plurality of data by using Raptor code so as to generate a Raptor codeword, wherein the plurality of identifiers respectively correspond to a plurality of receiving terminals; and modulating the Raptor codeword to generate a plurality of modulation symbols and broadcasting the plurality of modulation symbols.

Based on the above, the disclosure uses the error-correction code coding procedure to achieve non-orthogonal multiple access while avoiding using the power domain to implement non-orthogonal multiple access techniques, so that system performance is not easily affected by locations of the receiving terminals.

To make the aforementioned and other features and advantages of the disclosure more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
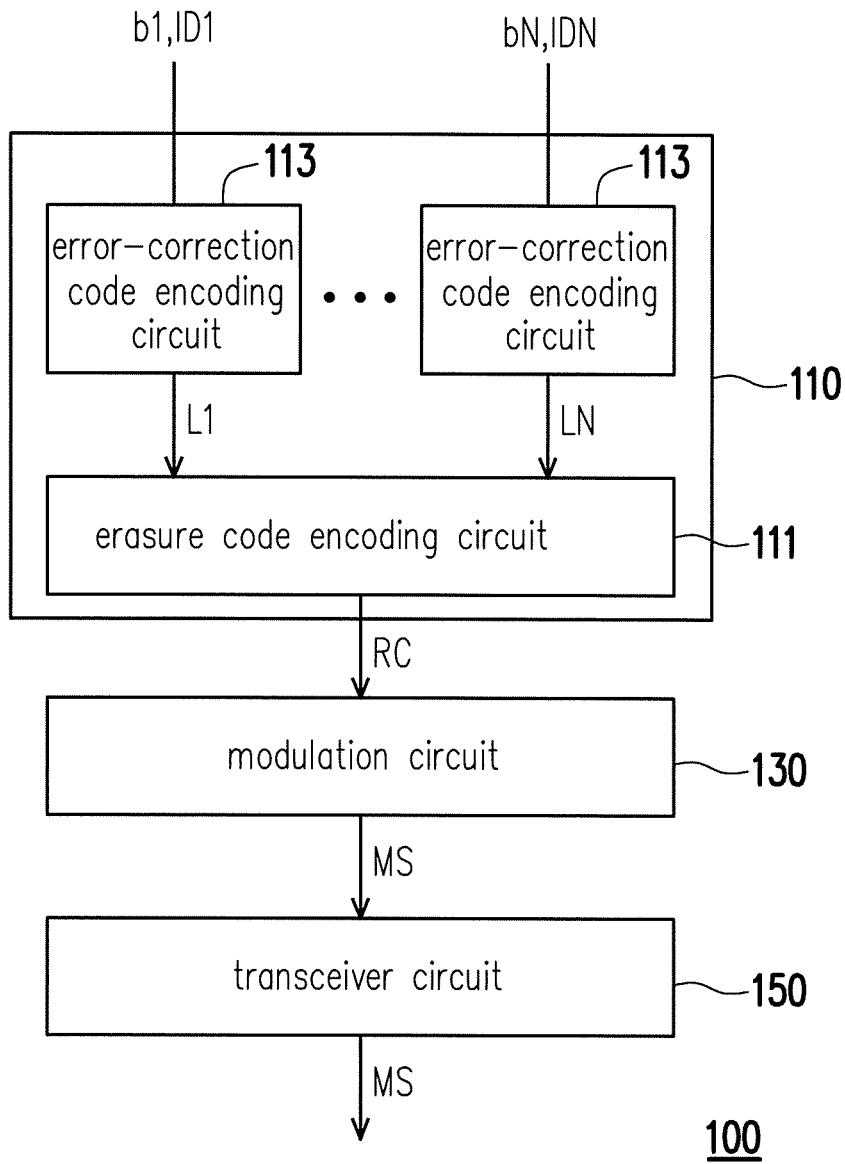
FIG. 1 shows a circuit diagram of a transmission device adapted for non-orthogonal multiple access data transmission according to an embodiment of the disclosure.

FIG. 1 shows a circuit diagram of a transmission device adapted for non-orthogonal multiple access data transmission according to an embodiment of the disclosure. The embodiment of FIG. 1 uses a downlink example. However, a person skilled in the art, based on the embodiment of FIG. 1, should be able to easily deduce how this disclosure may be applied to an uplink case.

In this embodiment, a transmission device 100 is adapted for non-orthogonal multiple access data transmission, and includes a Raptor code encoding circuit 110, a modulation circuit 130, and a transceiver circuit 150. The modulation circuit 130 is coupled to the Raptor code encoding circuit 110 and modulates a Raptor codeword to generate a plurality of modulation symbols. For example, the modulation circuit 130 may perform quadrature amplitude modulation (QAM) on a Raptor codeword RC to convert the Raptor codeword RC into a plurality of quadrature amplitude modulation symbols MS to be transmitted by the transceiver circuit 150. The transceiver circuit 150 is coupled to the modulation circuit 130, and after the modulation circuit 130 generates the plurality of modulation symbols MS, the transceiver circuit 150 broadcasts the plurality of modulation symbols MS to each of a plurality of receiving terminals.

The Raptor code encoding circuit 110 has a plurality of signal input terminals configured to receive a plurality of data that respectively contain a plurality of identifiers corresponding to the data, and the plurality of identifiers respectively correspond to the plurality of receiving terminals. For example, in the case where the Raptor code encoding circuit 110 receives N data (data b1, . . . , data bN, etc.), the N data (data b1, . . . , data bN, etc.) respectively contain N identifiers (ID1, . . . , IDN, etc.) that respectively correspond to the N data, and the N identifiers (ID1, . . . , IDN, etc.) respectively correspond to N receiving terminals. The Raptor code encoding circuit 110 performs channel encoding for the N data b1~bN (N as a positive integer) by using Raptor code. That is, during the stage when each of the data b1~bN is a binary signal, the data b1~bN are jointly encoded and converted into the Raptor codeword RC.

The Raptor code is a class of fountain code. By using the Raptor code, the data b1~bN are compiled into a string of Raptor codeword RC with an infinite sequence of encoded symbols. Ideally speaking, after the Raptor codeword RC is modulated to be converted into the plurality of modulation symbols MS with an infinite sequence of encoded symbols, the receiving terminal only needs to obtain a subset of the same or a slightly larger size of the original data b1~bN from the plurality of modulation symbols MS continuously broadcasted by the transmission device 100, thereby restoring the subset to a Raptor codeword RC' that contains the data b1~bN, and the original data b1~bN is then restored from the Raptor codeword RC'. Here the Raptor codeword RC' is a subset of the Raptor codeword RC.

In this embodiment, the Raptor code encoding circuit 110 includes a plurality of error-correction code (ECC) encoding circuits 113 and an erasure code encoding circuit 111. Each of the ECC encoding circuits 113 has a signal input terminal to receive the data b1~bN respectively. The ECC encoding circuits 113 perform encoding for the data b1~bN and the identifiers ID1~IDN respectively corresponding to the data b1~bN by using error-correction code, so as to generate a plurality of ECC codewords L1~LN respectively corresponding to the identifiers ID1~IDN. The error-correction code is, for example, low-density parity-check (LDPC) code or BCH code or other different kinds of error-correction code, and the disclosure is not limited thereto. For example, the ECC encoding circuits 113 may perform encoding respectively for the data b1~bN and the identifiers ID1~IDN respectively corresponding to the data b1~bN by using the LDPC code so as to output the ECC codewords L1~LN respectively.

The erasure code encoding circuit 111 is coupled to the ECC encoding circuits 113 and the modulation circuit 130, and performs encoding for the ECC codewords L1~LN by using erasure code so as to convert the ECC codewords L1~LN into the Raptor codeword RC. Then, the Raptor codeword RC is modulated by the modulation circuit 130 to generate the plurality of modulation symbols MS. The erasure code used by the erasure code encoding circuit 111 is, for example, Luby Transform (LT) code, but the disclosure is not limited thereto.

In this embodiment, the transmission device 100 is, for example, an eNB, a Home eNB, an advanced base station (ABS), a base transceiver system (BTS), an access point, a Home BS, a repeater, an intermediate node, an intermediate equipment and/or a satellite-based communication base station. But the embodiments of the disclosure are not limited thereto.

The modulation circuit 130 may modulate an input signal via methods such as amplitude-shift keying (ASK), phase-shift keying (PSK), quadrature amplitude modulation (QAM) and frequency-shift keying (FSK) so as to convert the input signal into the modulation symbols to be transmitted by the transceiver circuit 150. But the embodiments of the disclosure are not limited thereto.

The transceiver circuit 150 is, for example, a transmitter circuit, an analog-to-digital (A/D) converter, a digital-to-analog (D/A) converter, a low noise amplifier, a mixer, a filter, an impedance matcher, a transmission line, a power amplifier, one or more antenna circuits, a local storage media component, or a combination thereof. But the disclosure is not limited thereto.

Figure 2:
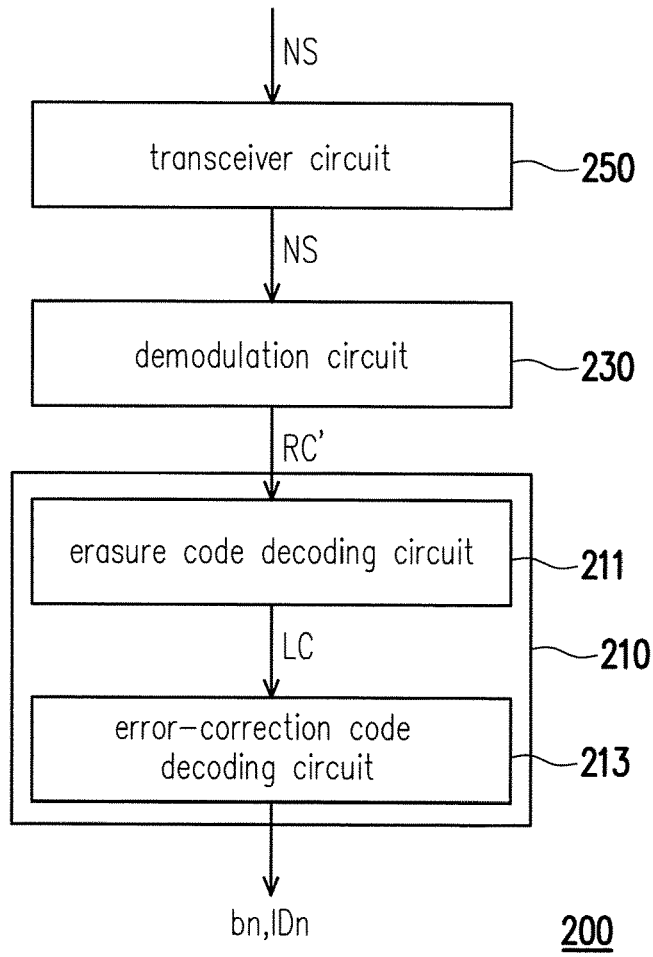
FIG. 2 shows a circuit diagram of a receiving terminal adapted for non-orthogonal multiple access data transmission according to an embodiment of the disclosure.

FIG. 2 shows a circuit diagram of a receiving terminal adapted for non-orthogonal multiple access data transmission according to an embodiment of the disclosure. The embodiment of FIG. 2 uses a downlink example. However, a person skilled in the art, based on the embodiment of FIG. 2, should be able to easily deduce how this disclosure may be applied to an uplink case.

In this embodiment, a receiving terminal 200 is adapted for non-orthogonal multiple access data transmission, and includes a Raptor code decoding circuit 210, a demodulation circuit 230, and a transceiver circuit 250. In this embodiment, it is assumed that the data corresponding to the receiving terminal 200 is data bn and identifier IDn, wherein $1 \le n \le N$ and n is a positive integer.

The transceiver circuit 250 receives a plurality of modulation symbols that correspond to a plurality of data. This embodiment uses the transceiver circuit 250 receiving a set of modulation symbols NS that have N data (data b1, . . . , data bN) as an example, and assumes that the data corresponding to the receiving terminal 200 is data bn, wherein $1 \le n \le N$ and n is a positive integer. The demodulation circuit 230 is coupled to the transceiver circuit 250 and performs demodulation on the modulation symbols to restore the signal that has been modulated.

In this embodiment, the receiving terminal 200 receives the plurality of modulation symbols NS and performs demodulation and decoding for the plurality of modulation symbols NS so as to obtain N data b1~bN and identifiers ID1~IDN respectively corresponding to the data b1~bN. Moreover, the receiving terminal 200 performs identification for the identifiers ID1~IDN and selects among the identifiers ID1~IDN a selected identifier IDn that corresponds to the receiving terminal 200. Then, the receiving terminal 200, based on the selected identifier IDn, reads the data bn corresponding to the selected identifier IDn.

Specifically, the demodulation circuit 230 demodulates the set of modulation symbols NS to obtain a Raptor codeword RC'. For example, assuming that the set of modulation symbols NS are quadrature amplitude modulation symbols, the demodulation circuit 230 may perform quadrature amplitude demodulation on the set of modulation symbols NS and convert the set of modulation symbols NS into the Raptor codeword RC' that contains the N data (data b1, . . . , data bN).

In this embodiment, the plurality of modulation symbols NS are a subset of a plurality of modulation symbols MS, and the plurality of modulation symbols MS are generated by a transmission device 100 that performs channel encoding for the N data b1~bN by using Raptor code. In light of the characteristics of the Raptor code as mentioned in the embodiment of FIG. 1, the receiving terminal 200, in an ideal situation, only needs to receive a subset of the same or a slightly larger size of the original data b1~bN from the plurality of modulation symbols MS, such as the plurality of modulation symbols NS, thereby restoring the subset to the Raptor codeword RC' that contains the data b1~bN, and the original data b1~bN is then restored from the Raptor codeword RC'.

The Raptor code decoding circuit 210 is coupled to the demodulation circuit 230. After the demodulation circuit 230 demodulates the Raptor codeword RC', the Raptor code decoding circuit 210 performs decoding for the Raptor codeword RC', and identifies among the identifiers ID1~IDN the selected identifier IDn that corresponds to the receiving terminal 200. Then the receiving terminal 200, via the selected identifier IDn, identifies the data n belonging to the receiving terminal 200 and performs reading.

In this embodiment, the Raptor code decoding circuit 210 includes an erasure code decoding circuit 211 and an error-correction code (ECC) decoding circuit 213. The erasure code decoding circuit 211 is coupled to the demodulation circuit 230, and performs decoding for the Raptor codeword RC' by using erasure code so as to obtain an ECC codeword LC corresponding to the N data (data b1, ..., data bN). The erasure code used by the erasure code decoding circuit 211 is, for example, LT code, but the disclosure is not limited thereto.

The ECC decoding circuit 213 is coupled to the erasure code decoding circuit 211. After the erasure code decoding circuit 211 obtains the ECC codeword LC, the ECC decoding circuit 213 performs decoding for the ECC codeword LC by using error-correction code so as to obtain the selected identifier IDn, and identifies the data n belonging to the receiving terminal 200 via the selected identifier IDn. The error-correction code is, for example, LDPC code or BCH code or other different kinds of error-correction code. The disclosure is not limited thereto.

In addition, the receiving terminal 200 is, for example, a mobile station, an advanced mobile station (AMS), a server, a user terminal, a desktop computer, a laptop computer, a network computer, a workstation, a personal digital assistant (PDA), a tablet personal computer (tablet PC), a scanner, a telephone device, a pager, a camera, a television, a handheld video game device, a music device, a wireless sensor, etc. But the embodiments of the disclosure are not limited thereto.

The demodulation circuit 230 may use modulation methods such as amplitude-shift keying (ASK), phase-shift keying (PSK), quadrature amplitude modulation (QAM) and frequency-shift keying (FSK) to demodulate the modulation symbols so as to restore the signal that has been modulated. But the embodiments of the disclosure are not limited thereto.

On the other hand, the transceiver circuit 250 is, for example, a transmitter circuit, an analog-to-digital (A/D) converter, a digital-to-analog (D/A) converter, a low noise amplifier, a mixer, a filter, an impedance matcher, a transmission line, a power amplifier, one or more antenna circuits, a local storage media component, or a combination thereof. But the disclosure is not limited thereto.

Figure 3:
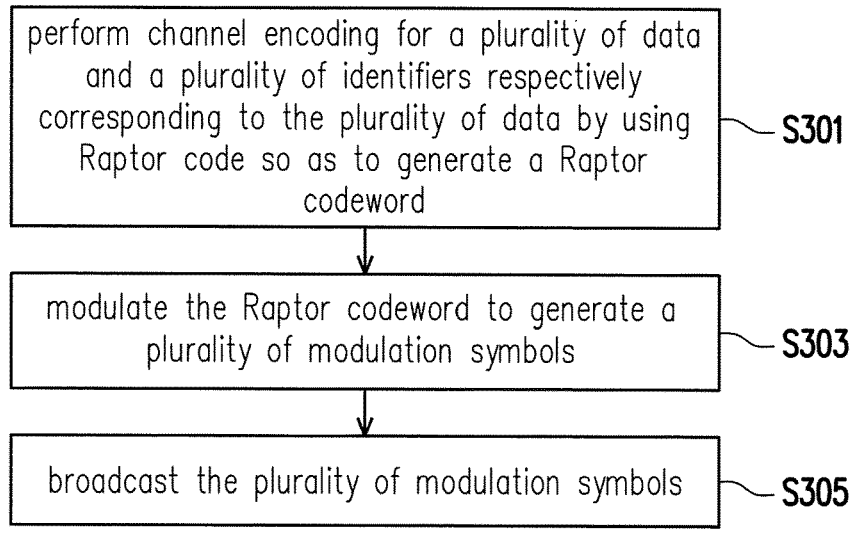
FIG. 3 shows a flowchart of a non-orthogonal multiple access data transmission method according to an embodiment of the disclosure.

FIG. 3 shows a flowchart of a non-orthogonal multiple access data transmission method according to an embodiment of the disclosure. In step S301, a Raptor code encoding circuit 110 performs channel encoding for a plurality of data b1~bN and a plurality of identifiers ID1~IDN respectively corresponding to the plurality of data by using Raptor code so as to generate a Raptor codeword RC, wherein the identifiers ID1~IDN respectively correspond to a plurality of receiving terminals. In step S303, a modulation circuit 130 modulates the Raptor codeword RC to generate a plurality of modulation symbols MS. In step S305, a transceiver circuit 150 broadcasts the modulation symbols MS.

Implementation details of the above steps have already been elaborated in the foregoing embodiments, so repeated description is omitted here.

In summary, in this disclosure, the ECC coding procedure is used to achieve non-orthogonal multiple access. Each of the plurality of receiving terminals, via the identifier that each receiving terminal respectively corresponds to, separates the data belonging to itself from the plurality of data that are received. Furthermore, the receiving terminal of this disclosure does not need to demodulate the data belonging to itself from the received signals by using SIC techniques. Consequently, in the case where the plurality of receiving terminals are closely located, the receiving terminals do not interfere with one another so as to cause a decrease in bandwidth efficiency as a result of the similar transmit power of the respective data.

Although the embodiments are already disclosed as above, these embodiments should not be construed as limitations on the scope of the disclosure. It will be apparent to those skilled in the art that various modifications and variations can be made to the disclosed embodiments without departing from the scope or spirit of this disclosure. In view of the foregoing, it is intended that the disclosure covers modifications and variations provided that they fall within the scope of the following claims and their equivalents.

What is claimed is:

1. A transmission device adapted for non-orthogonal multiple access data transmission with a plurality of receiving terminals, comprising:
    a Raptor code encoding circuit that performs channel encoding for a plurality of data and a plurality of identifiers respectively corresponding to the plurality of data by using Raptor code so as to generate a Raptor codeword, wherein each of the plurality of identifiers corresponds to one of the plurality of receiving terminals and is used to identify the one of the plurality of receiving terminals;
    a modulation circuit coupled to the Raptor code encoding circuit, the modulation circuit modulating the Raptor codeword to generate a plurality of modulation symbols; and
    a first transceiver circuit coupled to the modulation circuit, the first transceiver circuit broadcasting the plurality of modulation symbols to the plurality of receiving terminals.

2. The transmission device as recited in claim 1, wherein the Raptor code encoding circuit further comprises:
    a plurality of error-correction code encoding circuits that perform encoding for the plurality of data and the plurality of identifiers respectively corresponding to the plurality of data by using error-correction code so as to generate a plurality of error-correction code codewords respectively corresponding to the plurality of identifiers; and
    an erasure code encoding circuit that performs encoding for the plurality of error-correction code codewords by using erasure code so as to obtain the Raptor codeword.

3. The transmission device as recited in claim 2, wherein the error-correction code is one of BCH code and low-density parity-check code, and the erasure code is Luby Transform code.

4. The transmission device as recited in claim 1, wherein a first receiving terminal of the plurality of receiving terminals receives a subset of the plurality of modulation symbols and performs demodulation and decoding the subset of the plurality of modulation symbols so as to obtain the plurality of data and the plurality of identifiers; and the first receiving terminal identifies the plurality of identifiers to obtain a selected identifier corresponding to the first receiving terminal so as to read data corresponding to the selected identifier.

5. The transmission device as recited in claim 4, wherein the first receiving terminal comprises:
   a second transceiver circuit that receives the subset of the plurality of modulation symbols;
   a demodulation circuit coupled to the second transceiver circuit, the demodulation circuit demodulating the subset of the plurality of modulation symbols to obtain a subset of the Raptor codeword corresponding to the plurality of data; and
   a Raptor code decoding circuit coupled to the demodulation circuit, the Raptor code decoding circuit performing decoding the subset of the Raptor codeword to obtain the selected identifier corresponding to the first receiving terminal.

6. The transmission device as recited in claim 5, wherein the Raptor code decoding circuit comprises:
   an erasure code decoding circuit coupled to the demodulation circuit, the erasure code decoding circuit performing decoding the subset of the Raptor codeword by using erasure code to obtain a first error-correction code codeword corresponding to the plurality of data; and
   an error-correction code decoding circuit coupled to the erasure code decoding circuit, the error-correction code decoding circuit performing decoding the first error-correction code codeword by using error-correction code so as to obtain the selected identifier.

7. The transmission device as recited in claim 1, wherein each of the plurality of data is a binary signal.

8. A non-orthogonal multiple access data transmission method, comprising:
   performing channel encoding for a plurality of data and a plurality of identifiers respectively corresponding to the plurality of data by using Raptor code so as to generate a Raptor codeword, wherein each of the plurality of identifiers corresponds to one of a plurality of receiving terminals and is used to identify the one of the plurality of receiving terminals; and
   modulating the Raptor codeword to generate a plurality of modulation symbols and broadcasting the plurality of modulation symbols to the plurality of receiving terminals.

9. The non-orthogonal multiple access data transmission method as recited in claim 8, further comprising:
   performing encoding for the plurality of data and the plurality of identifiers respectively corresponding to the plurality of data by using error-correction code so as to generate a plurality of error-correction code codewords respectively corresponding to the plurality of identifiers; and
   performing encoding for the plurality of error-correction code codewords by using erasure code so as to obtain the Raptor codeword.

10. The non-orthogonal multiple access data transmission method as recited in claim 9, wherein the error-correction code is one of BCH code and low-density parity-check code, and the erasure code is Luby Transform code.

11. The non-orthogonal multiple access data transmission method as recited in claim 8, further comprising:
    receiving a subset of the plurality of modulation symbols from each of the plurality of receiving terminals, and performing demodulation and decoding the subset of the plurality of modulation symbols so as to obtain the plurality of data and the plurality of identifiers; and
    identifying the plurality of identifiers to obtain a selected identifier and reading data corresponding to the selected identifier.

12. The non-orthogonal multiple access data transmission method as recited in claim 11, further comprising:
    demodulating the subset of the plurality of modulation symbols from the each of the plurality of receiving terminals so as to obtain a subset of the Raptor codeword corresponding to the plurality of data;
    performing decoding the subset of the Raptor codeword by using erasure code so as to obtain a first error-correction code codeword; and
    performing decoding the first error-correction code codeword by using error-correction code so as to obtain the plurality of data and the plurality of identifiers.

13. The non-orthogonal multiple access data transmission method as recited in claim 8, wherein each of the plurality of data is a binary signal.

* * * * *